(12) United States Patent
Na et al.

(10) Patent No.: US 9,681,551 B2
(45) Date of Patent: Jun. 13, 2017

(54) LOW TEMPERATURE CO-FIRED CERAMIC SUBSTRATE WITH EMBEDED CAPACITORS

(71) Applicant: SAMSUNG ELECTRO-MECHANICS CO., LTD., Suwon-Si, Gyeonggi-Do (KR)

(72) Inventors: Ji-Sung Na, Suwon-Si (KR);
Beom-Joon Cho, Suwon-Si (KR);
Jung-Goo Choi, Suwon-Si (KR);
Yun-Hwi Park, Suwon-Si (KR);
Kwang-Jae Oh, Suwon-Si (KR);
Ho-Sung Choo, Suwon-Si (KR);
Ji-Hwan Shin, Suwon-Si (KR)

(73) Assignee: SEMCNS CO., LTD., Seongnam-si, Gyeonggi-do (KR)

( * ) Notice: Subject to any disclaimer, the term of this patent is extended or adjusted under 35 U.S.C. 154(b) by 504 days.

(21) Appl. No.: 14/260,950

(22) Filed: Apr. 24, 2014

(65) Prior Publication Data
US 2015/0122536 A1    May 7, 2015

(30) Foreign Application Priority Data
Nov. 7, 2013   (KR) .................. 10-2013-0135056

(51) Int. Cl.
| | | |
|---|---|---|
| *H01G 4/005* | (2006.01) | |
| *H01G 4/30* | (2006.01) | |
| *H01G 4/008* | (2006.01) | |
| *H01G 4/228* | (2006.01) | |
| *H01G 4/20* | (2006.01) | |
| *H05K 1/18* | (2006.01) | |
| *H01G 4/12* | (2006.01) | |
| *H01G 4/232* | (2006.01) | |
| *H05K 1/03* | (2006.01) | |
| *H05K 3/46* | (2006.01) | |

(52) U.S. Cl.
CPC .......... *H05K 1/185* (2013.01); *H01G 4/0085* (2013.01); *H01G 4/12* (2013.01); *H01G 4/2325* (2013.01); *H01G 4/30* (2013.01); *H05K 1/0306* (2013.01); *H05K 3/4697* (2013.01)

(58) Field of Classification Search
CPC .......... H01G 4/30; H01G 4/12; H01G 4/0085; H01G 4/2325
USPC ............... 361/301.4, 303, 305, 306.3, 312
See application file for complete search history.

(56) References Cited

U.S. PATENT DOCUMENTS

| | | | | |
|---|---|---|---|---|
| 6,198,618 B1 * | 3/2001 | Ohtani | ............... | C03C 8/18 361/301.4 |
| 2008/0000061 A1 * | 1/2008 | Jeong | ............... | H01G 4/232 29/25.41 |
| 2010/0220427 A1 * | 9/2010 | Symes, Jr. | .......... | C04B 35/4682 361/321.4 |

(Continued)

*Primary Examiner* — Sherman Ng
(74) *Attorney, Agent, or Firm* — McDermott Will & Emery LLP

(57) ABSTRACT

The present invention relates to a low temperature co-fired ceramic substrate with embedded capacitors. According to an embodiment of the present invention, the low temperature co-fired ceramic substrate with embedded capacitors is able to prevent diffusion, peeling or loss of electrodes after low temperature firing by controlling composition ratio of various metals included in the substrate, resulting in good adhesion between the ceramic substrate and the capacitor.

12 Claims, 1 Drawing Sheet

(56) References Cited

U.S. PATENT DOCUMENTS

2014/0022689 A1* 1/2014 Kwag .................... H01G 4/232
361/301.4

* cited by examiner

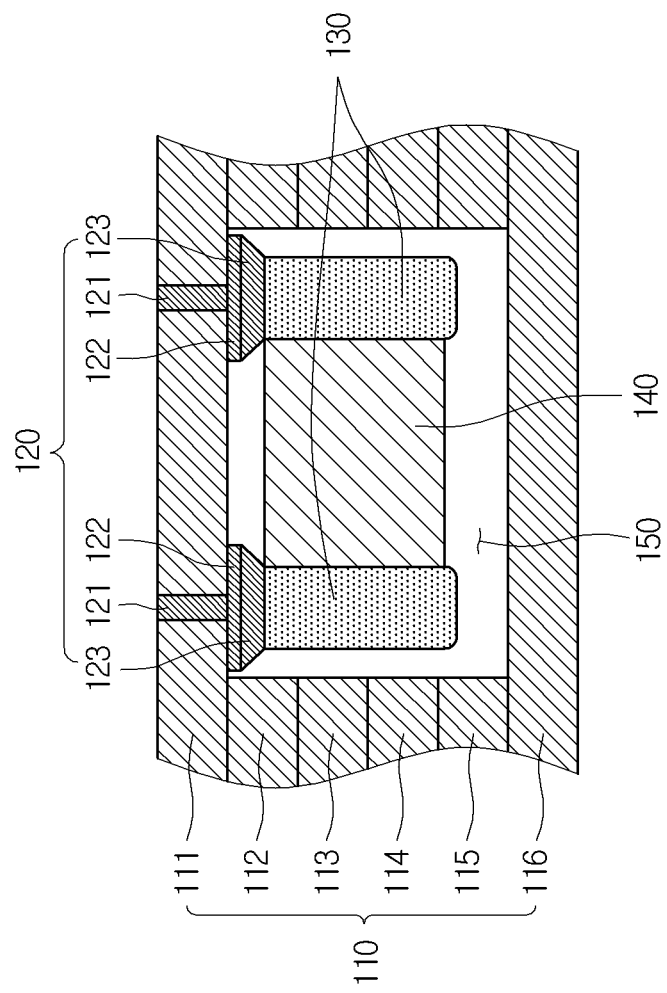

LOW TEMPERATURE CO-FIRED CERAMIC SUBSTRATE WITH EMBEDED CAPACITORS

CROSS REFERENCE TO RELATED APPLICATION

This application claims the benefit of Korean Patent Application No. 10-2013-0135056, filed on Nov. 7, 2013, entitled "Low temperature co-fired ceramic substrate with embedded capacitors", which is hereby incorporated by reference in its entirety into this application.

BACKGROUND OF THE INVENTION

1. Technical Field

The present invention relates to a low temperature co-fired ceramic substrate with embedded capacitors and more particularly, to a low temperature co-fired ceramic substrate with embedded capacitors comprising electrodes including Ag or Ag alloy.

2. Description of the Related Art

In response to demands for electronic devices with higher frequencies and smaller sizes, technologies which can reduce the volume of an entire product and increase degree of integration by embedding surface mount chip-type components in a printed circuit board rather than mounting onto the surface have received more attention.

When chip-type components mounted on the substrate are replaced by embedding them into a substrate by forming in layers (for example, capacitor), it reduces the volume of an entire product. Furthermore, layer-type capacitors have better RF characteristics (less parasitic inductance) compared to chip-type capacitors. Therefore, a great deal of development research is under way on embedding chips into a substrate.

Related art is KR Publication no. 2002-0042698.

SUMMARY OF THE INVENTION

An object of the present invention is to provide a low temperature co-fired ceramic substrate with embedded capacitors comprising electrodes comprising an Ag or Ag alloy.

According to an aspect of the present invention, there is provides a low temperature co-fired ceramic substrate with embedded capacitors in which a first electrode is laminated on a plurality of printed ceramic green sheets and cavities are formed in the substrate, the substrate comprising: a multi-layer ceramic capacitor arranged to be spaced-apart from the ceramic green sheets inside the cavity and comprising second electrodes which are electrically connected to the first electrode, wherein the first electrode includes 95-100 wt % of Ag, and wherein the second electrode includes 65-90 wt % of Ag and a metal having a higher melting point than that of Ag.

In an embodiment of the present invention, the first electrode may further comprise at least one chosen from Au, Cu, Pd, W and an alloy thereof In an embodiment of the present invention, the first electrode may comprise via electrodes passing through the ceramic green sheets and connecting electrodes electrically connecting with the second electrode.

In an embodiment of the present invention, the first electrode may further comprise pad electrodes between the via electrode and the connecting electrode In an embodiment of the present invention, the second electrode may include 65-90 wt % of Ag; and comprise at least one metal chosen from Au, Cu, Pd, W and an alloy thereof.

In an embodiment of the present invention, Ag may be added by 70-90 wt %.

In an embodiment of the present invention, the first electrode may further include 0.5-5 wt % of CaO—BaO—$SiO_2$—$B_2O_3$-based glass.

In an embodiment of the present invention, the glass transition temperature of the glass may be 600-850° C.

In an embodiment of the present invention, compositional formula of the glass may be 20CaO-25BaO-50$SiO_2$-5$B_2O_3$ or 20CaO-20BaO-55$SiO_2$-5$B_2O_3$.

In an embodiment of the present invention, firing temperature of the low temperature co-fired ceramic substrate with embedded capacitors may be 800-950° C.

According to an embodiment of the present invention, the low temperature co-fired ceramic substrate with embedded capacitors is able to prevent diffusion, peeling or loss of electrodes after low temperature firing by controlling composition ratio of various metals included in the substrate, resulting in good adhesion between the ceramic substrate and the capacitor.

BRIEF DESCRIPTION OF THE DRAWING

FIG. 1 is a sectional view illustrating a low temperature co-fired ceramic substrate with embedded capacitors according to an embodiment of the present invention.

DESCRIPTION OF THE EXEMPLARY EMBODIMENTS

Certain terms are defined herein for better understanding of the present invention. Unless otherwise defined in the present invention, scientific and technical terms used in the present invention will have the meanings commonly understood by those skilled in the art. Unless clearly used otherwise, expressions in the singular number include a plural meaning and expressions in a plural number include a singular meaning.

The low temperature co-fired ceramic substrate with embedded capacitors according to certain embodiments of the invention will be described below in more detail with reference to the accompanying drawings. It is to be appreciated that various changes and modifications may be made by those skilled in the art without departing from the spirit and scope of the embodiment herein, as defined by the appended claims and their equivalents.

FIG. 1 is a sectional view illustrating a low temperature co-fired ceramic substrate with embedded capacitors (hereinafter, referred to as "LTCC") according to an embodiment of the present invention.

A LTCC substrate according to the present invention is prepared by implementing components to form desired circuits on a plurality of ceramic green sheet layers 111 to 116, which are composed of mainly glass-ceramic materials, by screen printing; laminating the green sheet layers to form a ceramic element 110; and co-firing the ceramic and a conductive metal. The LTCC substrate allows incorporating components within the module since ceramic and metal can be co-fired so that it is able to provide devices with higher density and lighter in weight.

In an embodiment of the present invention, the ceramic green sheets 111 to 116 may comprise a ceramic filler and a glass component. The ceramic filler is a filler which can control properties of the LTCC substrate such as strength and thermal expansion. An example of the filler may be alumina, silica, titania, forsterite, $ZrO_2$, cordierite, or a combination thereof, particularly alumina or silica but it is not limited thereto. In addition, the filler may be any as long as it can be densified with sintering of the glass component.

In an embodiment of the present invention, the ceramic green sheets 111 to 116 may be prepared by mixing the ceramic filler, the glass component and a binder in a solvent. The ceramic sheet may be prepared by further including a dispersing agent to improve physical properties.

In an embodiment of the present invention, a cavity (or space) may be formed in the LTCC substrate according to the present invention and a multi-layer ceramic capacitor (hereinafter referred to as "MLCC") is arranged to be spaced-apart from the ceramic element 110.

Here, internal connectivity patterns are formed to connect with an outer terminal to exchange signals with the outside on the MLCC 140 which is spaced apart from the ceramic element 110 inside the cavity 150. Such internal connectivity patterns may be connection by electrodes and the connection may be made through electrodes inside the LTCC substrate. Furthermore, the electrodes may be selectively present in any layer among the plurality of green sheet layers 111 to 116.

For example, the MLCC 140 may comprise a plurality of dielectric layers and a plurality of capacitor internal electrodes formed between each dielectric layers and the plurality of capacitor internal electrodes may be electrically connected with the second electrode 130 which is electrically connected to the first electrode 120.

More particularly, the first electrodes 120 may be printed in the laminated plurality of ceramic green sheets 111 to 116. The first electrodes 120 may be electrodes to electrically connect between the ceramic green sheets 111 to 116, electrically connect between the ceramic element 110 and the MLCC 140, and to connect between the LTCC substrate with embedded capacitors and an external power. Here, the electrode to connect between the LTCC substrate with embedded capacitors and an external power may be connected with an external power by forming an external electrode in the area which is exposed to outside among the first electrodes 120 printed on the ceramic green sheet.

In an embodiment of the present invention, the first electrode 120 may comprise via electrodes 121 which pass through the ceramic green sheets, and connecting electrodes 123 which connect electrically with the second electrode 130. In another embodiment of the present invention, the first electrode 120 may further comprise pad electrodes 122 between the via electrode 121 and the connecting electrode 123.

The via electrode 121 may be formed by passing through at least one layer of the laminated plurality of ceramic green sheets 111 to 116. The via electrode 121 is electrically connected to the second electrode 130 through the connecting electrode 123 and the second electrode 130 is electrically connected with the MLCC 140. The pad electrode 122 may be selectively placed between the via electrode 121 and the connecting electrode 123.

For example, when the pad electrode 122 is printed by using paste including a large amount of a binder and high viscosity which is useful for connection electrodes, after firing, it may be difficult to distinguish between the pad electrode 122 and the connecting electrode 123. When the via electrode 121 can be directly connected or electrically connected to the connecting electrode 123 or the second electrode 130 after firing, the pad electrode 122 may be selectively included.

In an embodiment of the present invention, when the pad electrode 122 is included, the pad electrode 122 and the connecting electrode 123 should be co-fired and after firing, it shall be able to maintain a good connection electrically with the via electrode 121 and the second electrode 130.

The LTCC substrate with embedded MLCC according to an embodiment of the present invention is able to prevent diffusion, peeling or loss of electrodes after low temperature firing by controlling kinds and amounts of various metals included in the electrode.

In an embodiment of the present invention, the first electrode 120 includes 95-100 wt % of Ag and in another embodiment, the first electrode 120 may further include at least one chosen from Au, Cu, Pd, W and an alloy thereof.

When amount of Ag in the first electrode 120 is less than 95 wt %, other components other than Ag can be localized at the interface between electrodes of which kinds are different each other, resulting in poor connection or adhesion between the electrodes. It further causes insufficient bond strength between those electrodes. On the other hand, when amount of Ag in the first electrode 120 is more than 95 wt %, adhesive area is sufficiently secured at the interface between electrodes of which kinds are different each other, resulting in good adhesion between the first electrode 120 and the second electrode 130.

Furthermore, in an embodiment of the present invention, the first electrode 120 may further include glass to facilitate the diffusion of Ag at the interface between different types of electrodes to induce Ag—Ag bond formation. In an embodiment of the present invention, amount of the glass may be 0.5-5 wt %. When amount of the glass is more than 5 wt % with respect to the first electrode 120, the glass can be localized at the interface between different types of electrodes which further causes prevention from Ag—Ag bond formation and poor bond strength.

In an embodiment of the present invention, the glass may be borosilicate glasses, bismuth silicate glasses, zinc silicate glasses or a combination thereof but it is not limited thereto. An example of the glass includes $CaO$—$BaO$—$SiO_2$—$B_2O_3$-based glass, preferably $20CaO$-$25BaO$-$50SiO_2$-$5B_2O_3$ or $20CaO$-$20BaO$-$55SiO_2$-$5B_2O_3$. The glass transition temperature of the glass may be 600-850° C.

In another embodiment, the first electrode 120 may further include an inorganic oxide within the range which does not affect to the electrical connection with the second electrode 130.

In an embodiment of the present invention, there is provided a low temperature co-fired ceramic substrate with embedded capacitors in which the second electrode 130 includes 65-90 wt %, preferably 70-90 wt % of Ag and a metal having a higher melting point than that of Ag. Here, the metal having a higher melting point than that of Ag may include preferably at least one chosen from Au, Cu, Pd, W and an alloy thereof.

For example, the LTCC substrate with embedded MLCC according to the present invention may be prepared by embedding MLCC which is fired at about 1200° C. in the cavity 150 in the ceramic element 110 of the LTCC and firing at a relatively low temperature of about 900° C. When the firing temperature of the LTCC is higher than the melting point of metals included in the electrodes, the metal included in the electrodes can melt and diffuse which causes diffusion, peeling or loss of the electrodes.

Therefore, it is appreciated that the second electrode 130 includes a metal which can form an alloy with Ag and has a higher melting point than that of Ag so that it can have sufficient adhesive interface with the first electrode 120 and also maintain good adhesion with the MLCC 140.

When amount of Ag in the second electrode 130 is less than 65 wt %, there is not enough Ag—Ag bond formation at the interface with the first electrode 120, resulting in poor adhesion strength between the electrodes. On the other hand, when amount of Ag in the second electrode 130 is more than 90 wt %, Ag can melt and diffuse which thus causes narrowing the adhesion area with the MLCC 140 and forming pores.

Hereinafter, although more detailed descriptions will be given by examples, those are only for explanation and there is no intention to limit the invention.

EXAMPLES

Peeling, loss area ratio, bond strength and peeling type of the second electrode were determined according to the composition of the first electrode (the pad electrode and the connecting electrode) and the second electrode.

The compositions of the first electrode (the pad electrode and the connecting electrode) and the second electrode are shown in Table 1.

TABLE 1

| No. | Composition of the first electrode | | Composition of the second electrode | | |
|---|---|---|---|---|---|
| | Ag (wt %) | Glass (wt %) | Ag (wt %) | Metal with high melting point | Amount (wt %) |
| Example 1 | 100 | — | 70 | Pd | 30 |
| Example 2 | 100 | — | 70 | Au | 30 |
| Example 3 | 100 | — | 70 | Cu | 30 |
| Example 4 | 100 | — | 90 | W | 10 |
| Example 5 | 95 | — | 70 | Pd | 30 |
| Example 6 | 100 | — | 65 | Pd | 35 |
| Example 7 | 100 | — | 90 | Pd | 10 |
| Example 8 | 98 | 2 | 70 | Pd | 30 |
| Example 9 | 99.5 | 0.5 | 70 | Pd | 30 |
| Example 10 | 99 | 1 | 70 | Pd | 30 |
| Example 11 | 95 | 5 | 70 | Pd | 30 |
| Example 12 | 98 | 2 | 80 | Pd | 20 |
| Example 13 | 98 | 2 | 90 | Pd | 10 |
| Comparative Example 1 | 94 | — | 70 | Pd | 30 |
| Comparative Example 2 | 100 | — | 63 | Pd | 37 |
| Comparative Example 3 | 100 | — | 92 | Pd | 8 |
| Comparative Example 4 | 94 | 6 | 70 | Pd | 30 |
| Comparative Example 5 | 98 | 2 | 95 | Pd | 5 |

* Ag = Silver;
Pd = Palladium;
Au = Gold;
Cu = Copper;
W = Tungsten;
* Glass = 20CaO—25BaO—50SiO$_2$—5B$_2$O$_3$ (glass transition temperature 660° C.; 20 in 20CaO means mol %)

Referring to Table 1, Ag amount in the first electrode in Comparative Example 1; Ag amount in the second electrode in Comparative Examples 2 and 3; Ag amount in the first electrode in Comparative Example 4; and Ag amount in the second electrode in Comparative Example 5 were not within the desired range of the present invention.

Peeling and loss area ratio of the second electrode, and bond strength and peeling type of the first electrode and the second electrode were determined according to the composition of the first electrode (the pad electrode and the connecting electrode) and the second electrode as in Table 1.

TABLE 2

| No. | Peeling of the second electrode | Loss area ratio of the second electrode (%) | Bond strength (N) | Peeling type |
|---|---|---|---|---|
| Example 1 | No | 3 | 8 | A |
| Example 2 | No | 3 | 7 | A |
| Example 3 | No | 5 | 6 | A |
| Example 4 | No | 0.5 | 5 | A |
| Example 5 | No | 2 | 6 | A |
| Example 6 | No | 0.3 | 6 | A |
| Example 7 | No | 18 | 5 | A |
| Example 8 | No | 0.7 | 15 | A |
| Example 9 | No | 0.5 | 10 | A |
| Example 10 | No | 0.5 | 12 | A |
| Example 11 | No | 1.5 | 9 | A |
| Example 12 | No | 10 | 10 | A |
| Example 13 | No | 20 | 6 | A |
| Comparative Example 1 | No | 2 | 4 | B |
| Comparative Example 2 | No | 0.2 | 4 | B |
| Comparative Example 3 | Yes | 25 | 3 | C |
| Comparative Example 4 | Yes | 2 | 4 | B |
| Comparative Example 5 | Yes | 35 | 0.1 | C |

* Peeling type: A = LTCC/Pad (or connection) electrode interface;
B = Pad (or connection) electrode/second electrode interface; and
C = second electrode/MLCC interface Referring to Table 2, it is noted that there is no peeling of the second electrode in Examples 1-13 and there is no peeling at the pad (or connection) electrode/the second electrode interface (B type) or the second electrode/the MLCC interface (C type) but only at the LTCC/the pad (or connection) electrode interface (A type). In addition, loss area ratio and bond strength of the second electrode which should be considered to be useful for LTCC substrates with embedded MLCC were also excellent.

However, in Comparative Examples 1-5 in which Ag amount in the first electrode or the second electrode was deviated from the desired range of the present invention, it is noted that peeling of the second electrode was caused in Comparative Examples 3-5, peeling at the pad (or connection) electrode/the second electrode interface (B type) was caused in Comparative Examples 1, 2 and 4, and peeling at the second electrode/the MLCC interface (C type) was caused in Comparative Examples 3 and 5.

As described above, the present invention relates to a low temperature co-fired ceramic substrate with embedded capacitors in which a first electrode is laminated on a plurality of printed ceramic green sheets and cavities are formed in the substrate, the substrate comprising: a multilayer ceramic capacitor arranged to be spaced-apart from the ceramic green sheets inside the cavity and comprising second electrodes which are electrically connected to the first electrode, wherein the first electrode includes 95-100 wt % of Ag, and wherein the second electrode includes 65-90 wt % of Ag and a metal having a higher melting point than that of Ag. The low temperature co-fired ceramic substrate with embedded capacitors according to the present invention is able to prevent diffusion, peeling or loss of electrodes after low temperature firing by controlling composition ratio of various metals included in the substrate.

While it has been described with reference to particular embodiments, it is to be appreciated that various changes and modifications may be made by those skilled in the art without departing from the spirit and scope of the embodiment herein, as defined by the appended claims and their equivalents.

| Description of Reference Numberals |  |
| --- | --- |
| 110: Ceramic element | |
| 111, 112, 113, 114, 115, 116: Ceramic green sheet | |
| 120: First electrode | 121: Via electrode |
| 122: Pad electrode | 123: Connecting electrode |
| 130: Second electrode | 140: Multi-layer ceramic capacitor |
| 150: Cavity | |

What is claimed is:

1. A low temperature co-fired ceramic substrate with an embedded capacitor in which a first electrode is laminated on a plurality of printed ceramic green sheets and a cavity is formed in the substrate, the substrate comprising:
a multi-layer ceramic capacitor arranged inside the cavity and comprising a second electrode which is electrically connected to the first electrode,
wherein the first electrode includes 95-100 wt % of Ag, and
wherein the second electrode includes 65-90 wt % of Ag and a metal having a higher melting point than that of Ag.

2. The low temperature co-fired ceramic substrate with an embedded capacitor of claim 1, wherein the first electrode further comprises at least one selected from the group consisting of Au, Cu, Pd, W and an alloy thereof.

3. The low temperature co-fired ceramic substrate with an embedded capacitor of claim 1, wherein the first electrode comprises a via electrode passing through at least one of the plurality of printed ceramic green sheets and a connecting electrode electrically connected to the second electrode.

4. The low temperature co-fired ceramic substrate with an embedded capacitor of claim 3, wherein the first electrode further comprises a pad electrode between the via electrode and the connecting electrode.

5. The low temperature co-fired ceramic substrate with an embedded capacitor of claim 1, wherein the second electrode comprises at least one metal selected from the group consisting of Au, Cu, Pd, W and an alloy thereof.

6. The low temperature co-fired ceramic substrate with an embedded capacitor of claim 5, wherein the second electrode includes 70-90 wt % of Ag.

7. The low temperature co-fired ceramic substrate with an embedded capacitor of claim 1, wherein the first electrode further includes 0.5-5 wt % of $CaO$—$BaO$—$SiO_2$—$B_2O_3$-based glass.

8. The low temperature co-fired ceramic substrate with an embedded capacitor of claim 7, wherein the glass transition temperature of the glass is 600-850° C.

9. The low temperature co-fired ceramic substrate with an embedded capacitor of claim 8, wherein compositional formula of the glass is $20CaO\text{-}25BaO\text{-}50SiO_2\text{-}5B_2O_3$ or $20CaO\text{-}20BaO\text{-}55SiO_2\text{-}5B_2O_3$.

10. The low temperature co-fired ceramic substrate with an embedded capacitor of claim 1, wherein firing temperature of the low temperature co-fired ceramic substrate with embedded capacitors is 800-950° C.

11. The low temperature co-fired ceramic substrate with an embedded capacitor of claim 1, wherein the first electrode comprises a via electrode passing through at least one of the plurality of printed ceramic green sheets, and a pad electrode and connecting electrode disposed in the cavity.

12. The low temperature co-fired ceramic substrate with an embedded capacitor of claim 1, wherein the multi-layer ceramic capacitor is arranged to be spaced-apart from the plurality of printed ceramic green sheets.

* * * * *